(12) United States Patent
Yu et al.

(10) Patent No.: US 9,496,189 B2
(45) Date of Patent: Nov. 15, 2016

(54) STACKED SEMICONDUCTOR DEVICES AND METHODS OF FORMING SAME

(71) Applicant: Taiwan Semiconductor Manufacturing Company, Ltd., Hsin-Chu (TW)

(72) Inventors: Chen-Hua Yu, Hsin-Chu (TW); Chien-Hsun Lee, Chu-tung Town (TW); Tsung-Ding Wang, Tainan (TW); Jung Wei Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/517,627

(22) Filed: Oct. 17, 2014

(65) Prior Publication Data

US 2015/0364386 A1 Dec. 17, 2015

Related U.S. Application Data

(60) Provisional application No. 62/011,987, filed on Jun. 13, 2014.

(51) Int. Cl.
*H01L 21/66* (2006.01)
*H01L 25/065* (2006.01)
*H01L 25/00* (2006.01)
*H01L 23/00* (2006.01)

(52) U.S. Cl.
CPC .............. *H01L 22/20* (2013.01); *H01L 22/32* (2013.01); *H01L 24/97* (2013.01); *H01L 25/0657* (2013.01); *H01L 25/50* (2013.01); *H01L 22/14* (2013.01); *H01L 2224/16145* (2013.01); *H01L 2225/06596* (2013.01)

(58) Field of Classification Search
CPC ............................... H01L 22/00; H01L 22/30
See application file for complete search history.

(56) References Cited

U.S. PATENT DOCUMENTS

| | | | |
|---|---|---|---|
| 2011/0304349 | A1 | 12/2011 | Stillman et al. |
| 2013/0052760 | A1* | 2/2013 | Cho .......... H01L 22/14 438/15 |
| 2014/0179032 | A1 | 6/2014 | Hasebe et al. |
| 2014/0264337 | A1 | 9/2014 | Chen et al. |
| 2015/0228550 | A1* | 8/2015 | Yu ............ H01L 22/32 257/48 |

\* cited by examiner

*Primary Examiner* — Daniel Whalen
(74) *Attorney, Agent, or Firm* — Slater Matsil, LLP (57) ABSTRACT

Stacked semiconductor devices and methods of forming the same are disclosed. First tier workpieces are mounted on a top surface of a semiconductor device to form first tier stacks, the semiconductor device comprising one or more integrated circuit dies, the semiconductor device having one or more test pads per integrated circuit die on the top surface of the semiconductor device. Each of the first tier stacks is electrically tested to identify first known good stacks and first known bad stacks. Second tier workpieces are mounted atop the first known good stacks, thereby forming second tier stacks. Each of the second tier stacks is electrically tested to identify second known good stacks and second known bad stacks. Stacking process further comprises one or more workpiece mounting/testing cycles. The stacking process continues until the stacked semiconductor devices comprise desired number of workpieces.

19 Claims, 10 Drawing Sheets

STACKED SEMICONDUCTOR DEVICES AND METHODS OF FORMING SAME

PRIORITY CLAIM AND CROSS-REFERENCE

This application claims the benefit of U.S. Provisional Application Ser. No. 62/011,987, filed on Jun. 13, 2014, entitled "Testing Solution for Multiple Chip Stacking on InFO," which application is hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked semiconductor devices, e.g., 3D integrated circuits (3DICs), have emerged as an effective alternative to further reduce the physical size of a semiconductor device. In a stacked semiconductor device, wafers/dies are stacked on top of one another and are interconnected using through connections such as through vias (TVs). Some of the benefits of 3DICs, for example, include exhibiting a smaller footprint, reducing power consumption by reducing the lengths of signal interconnects, and improving yield and fabrication cost if individual dies are tested separately prior to assembly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Structures of stacked semiconductor devices and methods of forming the same are provided. In particular, stacked semiconductor devices with embedded test pads are described in greater detail below. In addition, methods of forming stacked semiconductor devices that are utilizing embedded test pads are also provided below.

Before addressing illustrated embodiments specifically, advantageous features and certain aspects of the exemplary embodiments are discussed generally. General aspects of embodiments described herein include test pads designed on a front side of an integrated fan-out (InFO) device upon which workpieces are mounted to form stacked semiconductor devices, simply referred as stacked devices below. As described below in greater detail, the workpieces may be integrated circuit dies, interposers, or the like. Another general aspect is that electronic functional testing, so-called E-test, can be applied during a stacking process, such as after each stacking step for stacking multiple workpieces, an E-test can be performed. In this way, known bad stacks (KBSs) can be identified and re-worked, replaced, flagged or otherwise accounted for during the stacking process. Another general aspect of the following embodiments is that further processing/stacking of additional workpieces can be limited to only known good stacks (KGSs), thus reducing manufacturing cost and improving overall yield. In addition, dummy workpieces (such as, for example, workpieces free from active and/or passive devices) may be stacked atop KBSs to maintain uniform form factors (such as, for example, thickness) for all stacked devices.

Figure 1:
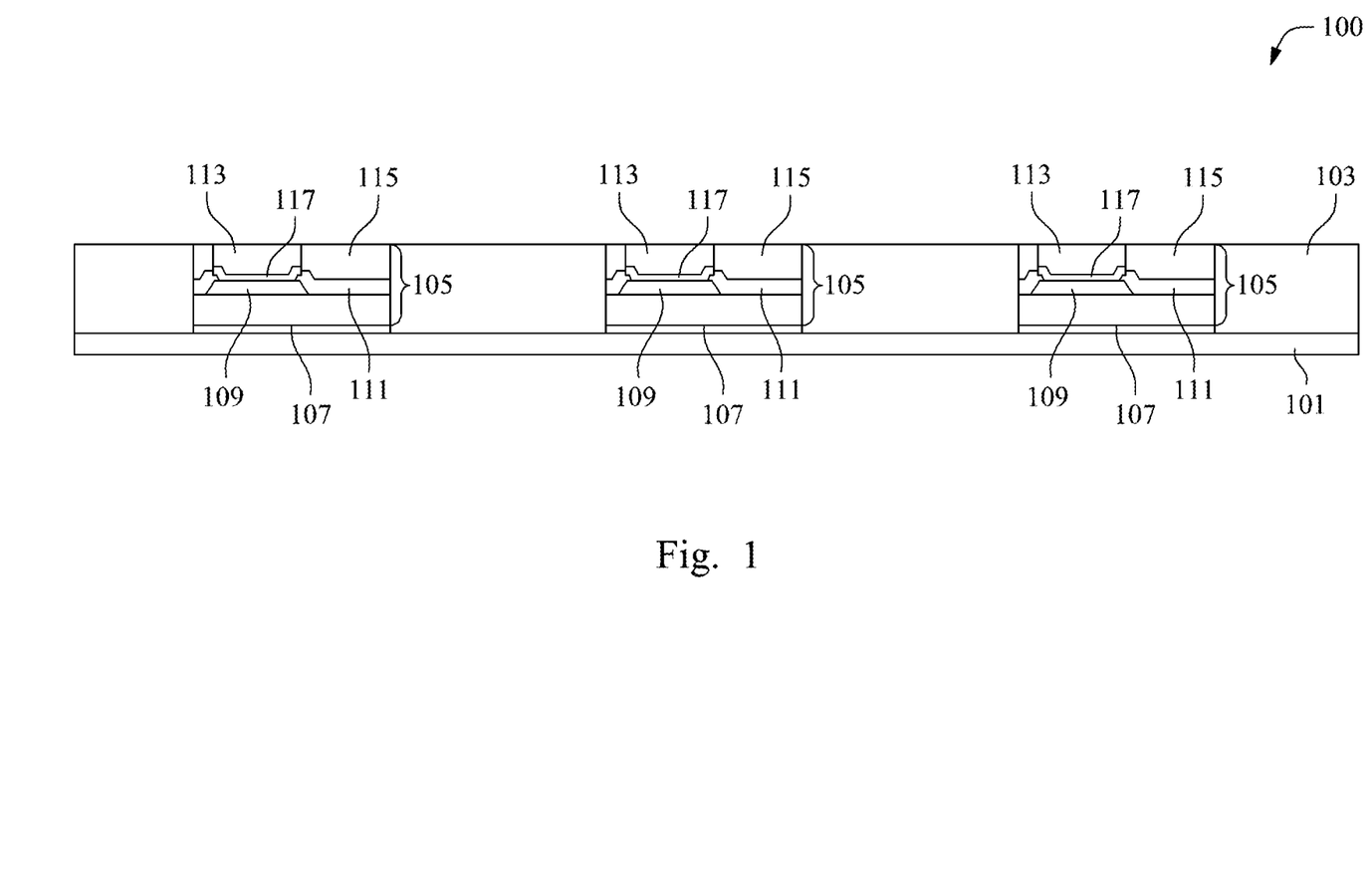
FIGS. 1-6 are cross-sectional views of various processing steps during fabrication of stacked semiconductor devices in accordance with some embodiments.
Figure 2:
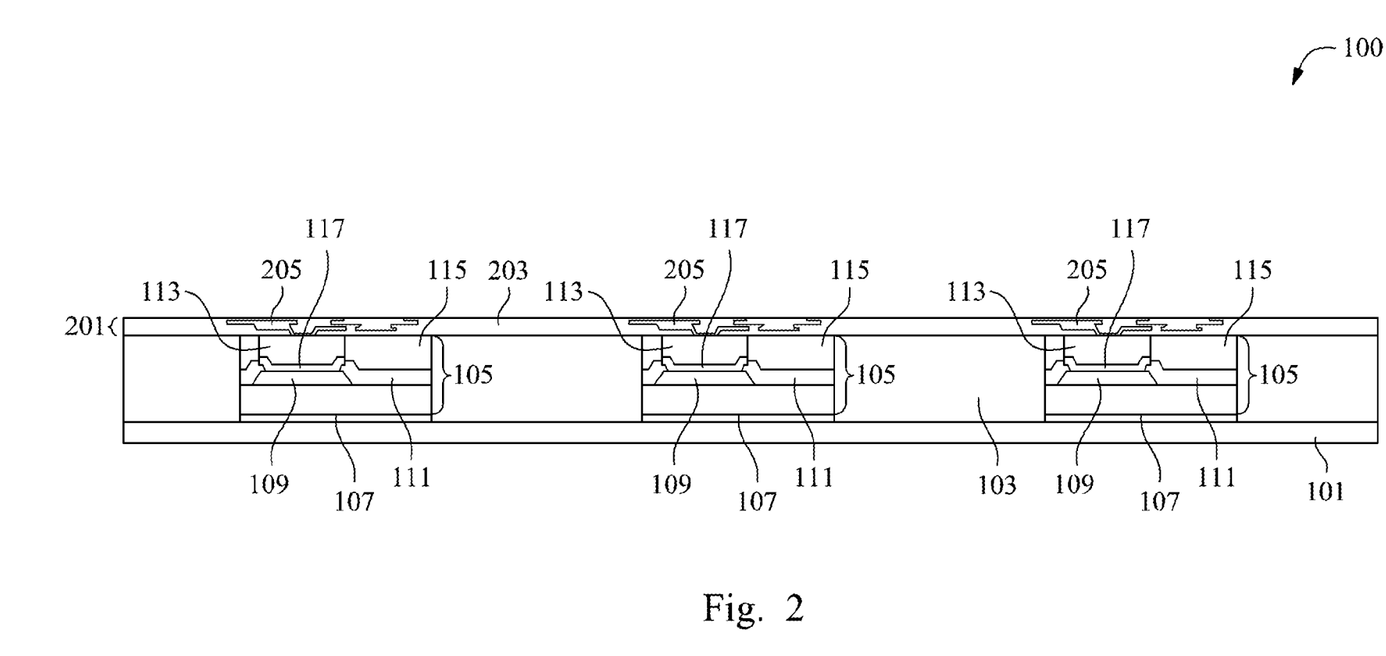
Figure 3:
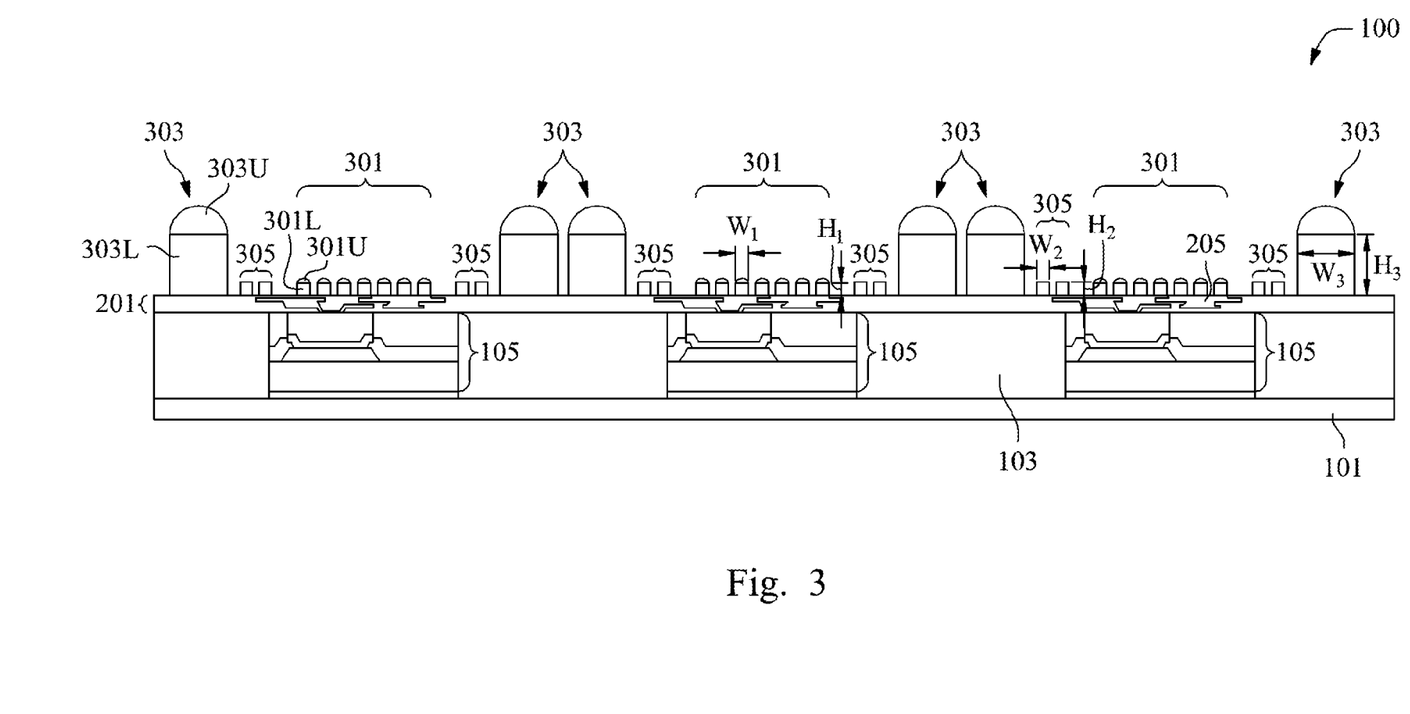
Figure 4:
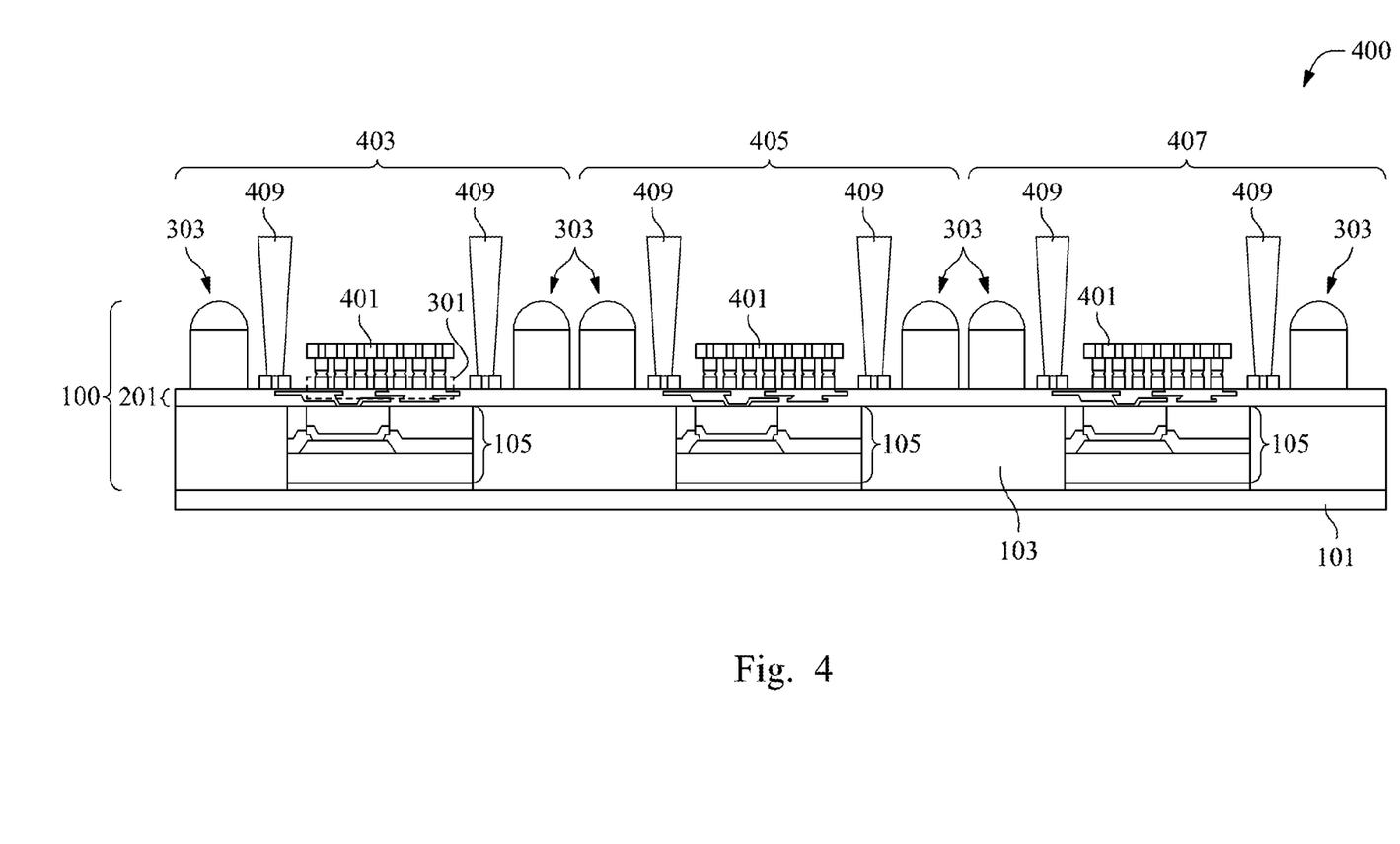
Figure 5:
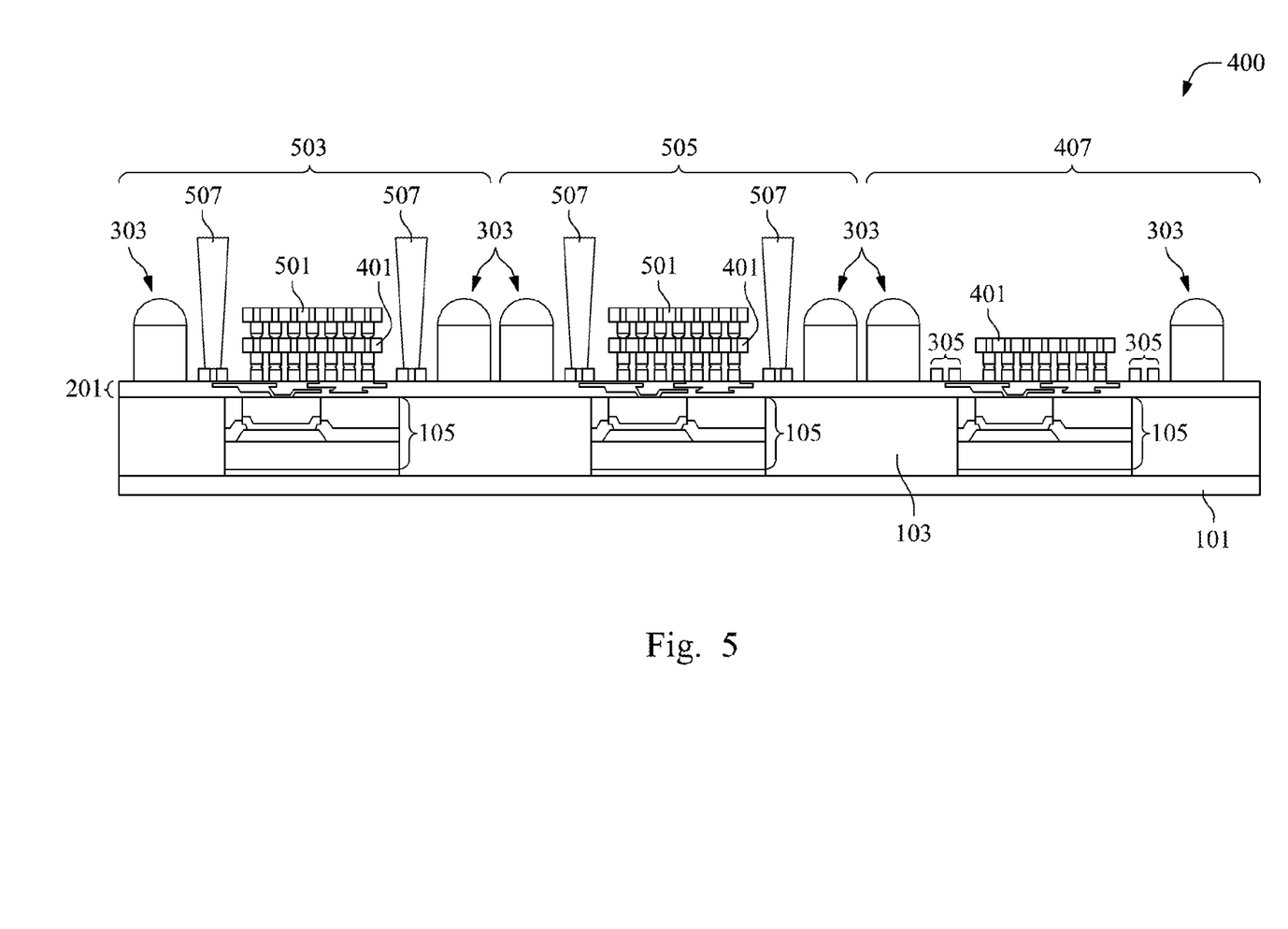
Figure 6:
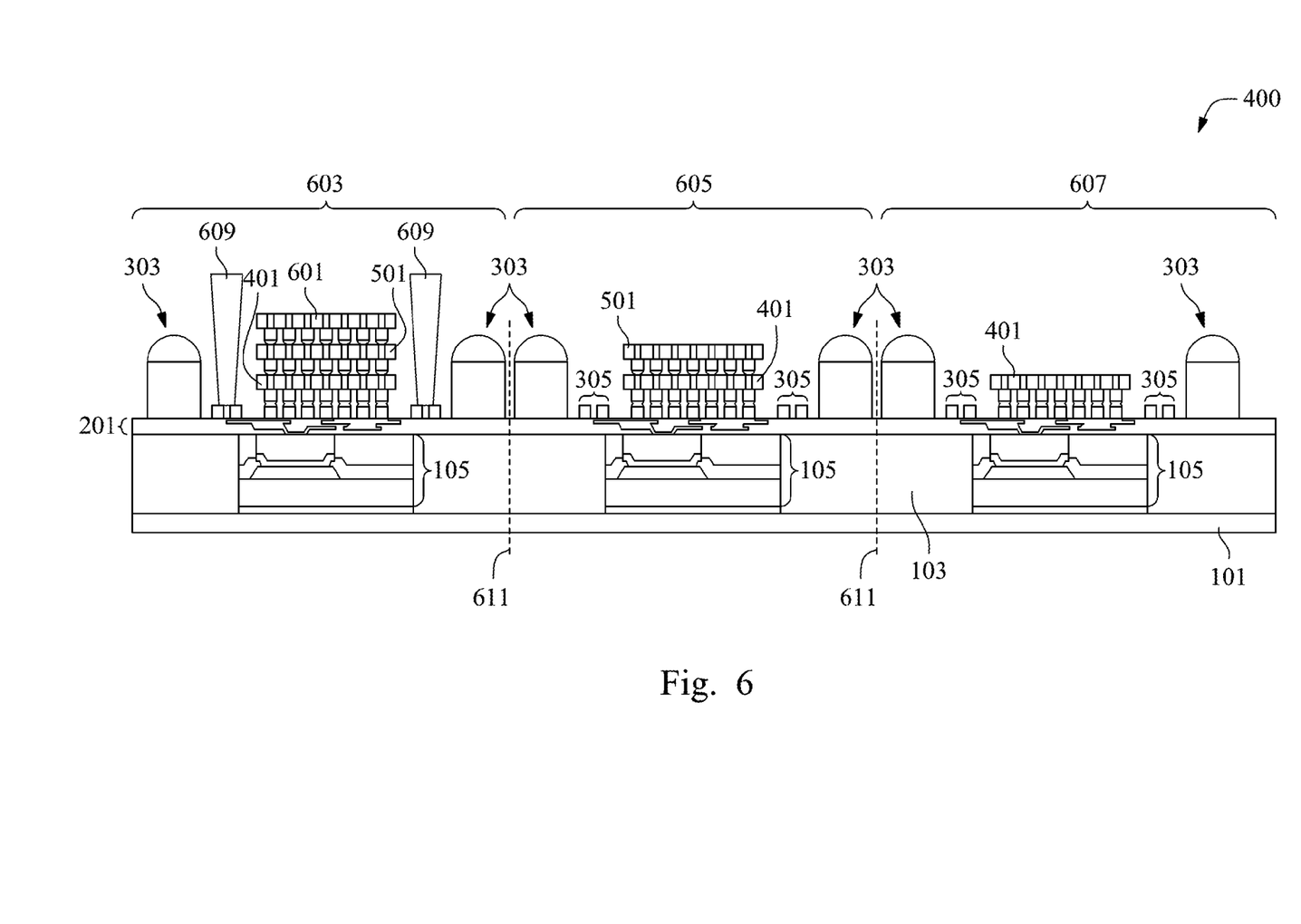

Turning now to the illustrated embodiments, FIGS. 1-6 illustrate cross-sectional views of various processing steps during fabrication of stacked semiconductor devices in accordance with some embodiments. In particular, FIGS. 1-3 illustrate cross-sectional views of various processing steps during fabrication of a semiconductor device 100 such as an InFO device in accordance with some embodiments. FIGS. 4-6 illustrate cross-sectional views of various processing steps during fabrication a semiconductor device 400, which is formed by stacking workpieces atop the semiconductor device 100 in accordance with some embodiments.

FIG. 1 illustrates dies 105 mounted on a carrier 101 and encapsulated by an encapsulant 103. The carrier 101 may be formed of quartz, glass, or the like, and provides mechanical support for subsequent operations. In some embodiments, the dies 105 are attached to the carrier 101 using, for example, a pick and place apparatus. In other embodiments, the dies 105 may be attached to the carrier 101 manually, or using any other suitable method. The dies 105 may be attached to the carrier 101 using one or more adhesive layers 107 formed on back sides of the dies 105. The one or more adhesive layers 107 may comprise a die attach film, any suitable adhesive, epoxy, wax, ultraviolet (UV) glue (which loses its adhesive property when exposed to UV radiation), or the like, and may be formed using a deposition process, a spin coating, a printing process, a lamination process, or the like.

In some embodiments, the dies 105 may be logic dies, memory dies, sensor dies, analog dies, or the like. The dies 105 may be formed using a complementary metal-oxide-semiconductor (CMOS) process, a micro-electro-mechanical systems (MEMS) process, a nano-electro-mechanical systems (NEMS) process, the like, or a combination thereof. In some embodiments, the dies 105 may be formed as part of a wafer. The wafer is singulated by sawing, laser ablation, or the like, to form individual dies 105. Subsequently, functional testing may be performed on the dies 105. Thus, the dies 105 in FIG. 1 may include only known good dies (KGDs), which have passed one or more functional quality tests.

As shown in FIG. 1, in some embodiments, each of the dies 105 includes a passivation layer 111, a contact pad 109 embedded in the passivation layer 111, a protective layer 115 over the passivation layer 111, a conductive via 113 embedded in the protective layers 115, and seed layer 117 interposed between the contact pad 109 and the conductive via 113 on a front side of each of the dies 105.

The dies 105 may comprise a substrate, various active and passive devices on the substrate, and various metallization layers over the substrate, which are not explicitly illustrated in FIG. 1 as their inclusion is not necessary for understanding various embodiments described below. The substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like.

In some embodiments, the variety of active and passive devices may include various n-type metal-oxide semiconductor (NMOS) and/or p-type metal-oxide semiconductor (PMOS) devices such as transistors, capacitors, resistors, diodes, photo-diodes, fuses and/or the like.

The metallization layers may include an inter-layer dielectric (ILD)/inter-metal dielectric layers (IMDs) formed over the substrate. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma enhanced CVD (PECVD).

In some embodiments, interconnect structures may be formed in the ILD/IMDs using, for example, a damascene process, a dual damascene process, or the like. The ILD/IMDs may be patterned using photolithography techniques to form trenches and vias. The interconnect structures are formed by depositing a suitable conductive material in the trenches and the vias of the ILD/IMDs using various deposition and plating methods, or the like. In addition, the interconnect structures may include one or more barrier/adhesion layers (not shown) to protect the ILD/IMDs from diffusion and metallic poisoning. The one or more barrier/adhesion layers may comprise titanium, titanium nitride, tantalum, tantalum nitride, or other alternatives. The barrier layer may be formed using physical vapor deposition (PVD), atomic layer deposition (ALD), sputtering, or the like. The conductive material of the interconnect structures may comprise copper, a copper alloy, silver, gold, tungsten, tantalum, aluminum, and the like. In an embodiment, the steps for forming the interconnect structures may include blanket forming the one or more barrier/adhesion layers, depositing a thin seed layer of a conductive material, and filling the trenches and the vias in the ILD/IMDs with the conductive material, for example, by plating. A chemical-mechanical polishing (CMP) is then performed to remove excess portions of the interconnect structures. In some embodiments, the interconnect structures may provide electrical connections between the various passive and active devices formed on the substrate.

Referring further to FIG. 1, the contact pad 109 is formed over the metallization layers and may be electrically coupled to the active devices through various interconnect structures of the metallization layers. In the illustrated embodiment, the contact pad 109 comprises aluminum, although other conductive materials such as copper, tungsten, silver, gold, the like, or a combination thereof may also be used. In the illustrated embodiment, the conductive material of the contact pad 109, such as aluminum, is deposited over the metallization layers and patterned to form the contact pad 109 as illustrated in FIG. 1. The contact pad 109 may be patterned using photolithography techniques. Generally, photolithography techniques involve depositing a photoresist material, which is subsequently irradiated (exposed) and developed to remove a portion of the photoresist material. The remaining photoresist material protects the underlying material, such as the conductive material of the contact pad 109, from subsequent processing steps, such as etching. A suitable etching process, such as a reactive ion etch (RIE) or other dry etch, an isotropic or anisotropic wet etch, or any other suitable etch or patterning process may be applied to the conductive material of the contact pad 109 to remove the exposed portion of the conductive material and form the contact pad 109. For example, exposed portions of the conductive material such as aluminum may be etched using a mixture of 80% phosphoric acid, 5% nitric acid, 5% acetic acid, and 10% de-ionized (DI) water. In other embodiments, the contact pad 109 comprising copper may be formed using, for example, a damascene process.

In some embodiments, the passivation layer 111 is formed over the metallization layers and the contact pad 109. In some embodiments, the passivation layer 111 may comprise dielectric materials such as polyimide, benzocyclobutene (BCB), polybenzoxazole (PBO), silicon nitride, silicon carbide, silicon oxide, silicon oxynitride, low-k dielectrics such as carbon doped oxides, extremely low-k dielectrics such as porous carbon doped silicon dioxide, the like, or a combination thereof. The passivation layer 111 may be deposited by chemical vapor deposition (CVD), physical vapor deposition (PVD), atomic layer deposition (ALD), a spin-on-dielectric process, the like, or a combination thereof.

Referring further to FIG. 1, an opening is formed in the passivation layer 111 to expose the contact pad 109. In some embodiments, a photoresist material (not shown) is formed over the passivation layer 111. The photoresist material is subsequently irradiated (exposed) and developed to remove a portion of the photoresist material. Subsequently, exposed portions of the passivation layer 111 are removed using, for example, a suitable etching process to form the openings. In an embodiment with the passivation layer 111 formed of silicon oxide, the passivation layer 111 is etched using, for example, buffered hydrofluoric acid (HF). In another embodiment with the passivation layer 111 formed of silicon nitride, the passivation layer 111 is etched using, for example, hot phosphoric acid ($H_3PO_4$).

The seed layer 117 and the conductive via 113 are formed on the exposed contact pad 109 as illustrated in FIG. 1. In some embodiments, the seed layer 117 may comprise a conductive material such as titanium, titanium nitride, tantalum, tantalum nitride, or other alternative, and may be formed using ALD, PVD, the like, or a combination thereof. The seed layer is formed on the passivation layer 111 and the contact pad 109 and a patterned mask having an opening (not shown) exposing a portion of the seed layer 117 on the contact pad 109 is formed on the seed layer 117. The opening is filled with a conductive material to form the conductive via 113. The conductive material may comprise copper, tungsten, aluminum, silver, gold, the like, or a combination thereof, and may be formed using an electrochemical plating process, an electroless plating process, ALD, PVD, the like, or a combination thereof.

After the conductive via 113 is formed, the patterned mask and portions of the seed layer 117 not interposed between the contact pad 109 and the conductive via 113 are removed. In some embodiments, the patterned mask formed of a photoresist material is removed using, for example, an ashing process followed by a wet clean process. The portions of the seed layer 117 may be removed using, for example, a suitable etch process and portions of the passivation layer 111 are exposed. The protective layer 115 is subsequently formed over the passivation layer 111 and conductive via 113. The protective layer 115 may comprise a dielectric material such as polyimide, benzocyclobutene (BCB), polybenzoxazole (PBO), the like, or a combination thereof, and may be formed using a spin-on coating process, or the like.

Referring further to FIG. 1, the encapsulant 103 is formed over the carrier 101 and between neighboring dies 105. In some embodiments, the encapsulant 103 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the dies 105.

In some embodiments, portions of the protective layers 115 and the encapsulant 103 extending over top surfaces of the conductive vias 113 may be removed to expose the conductive vias 113. The portions of the protective layers 115 and the encapsulant 103 may be removed using a CMP, a grinding process, an etch process, or another suitable thinning process. In some embodiment, the above process is performed until the top surfaces of the conductive vias 113 are substantially coplanar with top surfaces of the protective layers 115 and a top surface of the encapsulant 103 as illustrated in FIG. 1.

As shown in FIG. 1, each of the dies 105 comprises a single passivation layer (such as the passivation layer 111), a single contact pad (such as the contact pad 109), a single conductive via (such as the conductive via 113), and a single protective layer (such as the protective layer 115). One skilled in the art will recognize that numbers of passivation layers, contact pads, conductive vias, and the protective layers are provided for illustrative purpose only and are not limiting the scope of the present disclosure. In other embodiments, each of the dies 105 may comprise appropriate number of passivation layers, contact pads, conductive vias, and the protective layers depending on design requirements for the dies 105.

Referring to FIG. 2, one or more redistribution layers (RDLs) 201 are formed over the dies 105 and the encapsulant 103. In some embodiments, the RDLs 201 comprise one or more dielectric layers 203 and one or more conductive features 205 disposed within the one or more dielectric layers 203. In the illustrated embodiment, the one or more dielectric layers 203 are formed using materials and methods similar those of the protective layer 115 and the description is not repeated herein. In some embodiments, each of the one or more dielectric layers 203 may be patterned to expose underlying conductive features. For example, a bottommost dielectric layer of the one or more dielectric layers 203 is patterned to expose the underlying conductive vias 113. In some embodiment, the one or more dielectric layers 203 comprising photo-patternable materials may be patterned using an acceptable photolithography technique. For example, the bottommost dielectric layer of the one or more dielectric layers 203 is exposed to light and subsequently developed and/or cured.

Referring further to FIG. 2, a first conductive feature (not individually shown) of the one or more conductive features 205 is formed over the bottommost dielectric layer of the one or more dielectric layers 203. The first conductive feature may comprise various lines/traces (running "horizontally" across a top surface of the bottommost dielectric layer) and/or vias (extending "vertically" through the bottommost dielectric layer, and contacting the underlying conductive vias 113). In some embodiments, a seed layer (not shown) is deposited over the bottommost dielectric layer. The seed layer may comprise copper, titanium, nickel, gold, manganese, the like, or a combination thereof, and may be formed by ALD, PVD, sputtering, the like, or a combination thereof. Subsequently, a photoresist material (not shown) is deposited over the seed layer and patterned to define the desired pattern for the first conductive feature. A conductive material, such as copper, tungsten, aluminum, silver, gold, the like, or a combination thereof, and is formed on the seed layer by an electro-chemical plating process, an electroless plating process, ALD, PVD, the like, or a combination thereof. The photoresist material is removed using appropriate photoresist stripping process, such as ashing followed by a wet clean process. Exposed portions of the seed layer over the bottommost dielectric layer are removed using, for example, a wet or dry etch. Referring further to FIG. 2, the process described above is applied to other dielectric layers of the one or more dielectric layers 203 until formation of the RDLs 201 is completed.

Referring to FIG. 3, first connectors 301, second connectors 303, and test pads 305 are formed on a top surface of the RDLs 201. The first connectors 301 and the second connectors 303 provide electrical connections between external devices and the active and passive devices of the dies 105 (via the RDLs 201, the conductive vias 113, the contact pads 109, and the metallization layers of the dies 105). In some embodiments, the first connectors 301 may have first upper portions 301U and first lower portions 301L, and the second connectors 303 may have second upper portions 303U and second lower portions 303L. In some embodiments, the first lower portions 301L, the second lower portions 303L, and the test pads 305 may comprise conductive materials such as copper, tungsten, aluminum, silver, gold, the like, or a combination thereof, and may be formed using, an electrochemical plating process, an electroless plating process, ALD, PVD, the like, or a combination thereof. The first upper portions 301U and the second upper portions 303U may comprise solder materials such as lead-based solders such as PbSn compositions, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders also include SnCu compounds, without the use of silver (Ag), and SnAg compounds, without the use of copper (Cu).

In some embodiments, the first connectors 301 and the test pads 305 may be formed at the same time using a same formation method. In the illustrated embodiment, a topmost dielectric layer of the RDLs 201 is patterned to expose first portions and the second portions of the one or more conductive features 205. A first patterned mask (not shown) is formed over the topmost dielectric layer of the RDLs 201. In some embodiments, the first patterned mask comprises a photoresist material, or any photo-patternable material. A material of the first patterned mask is deposited, irradiated (exposed) and developed to remove portions of the material and form openings. The first patterned mask masks the second portions of the one or more conductive features 205 while exposes the first portions of the one or more conductive features 205 through the openings in the first patterned mask.

The openings in the first patterned mask are subsequently filled by a conductive material, thereby forming the first lower portion 301L of the first connectors 301 and the test pads 305. In some embodiments, the openings containing the first lower portions 301L of the first connectors 301 are further filled by solder material to form the first upper portion 301U of the first connectors 301 and complete formation of the first connectors 301. After the first connectors 301 and the test pads 305 are formed, the first patterned mask is removed. In an embodiment with the first patterned mask comprising a photoresist material, the first patterned mask may be removed using, for example, ashing followed by a wet clean process. In the illustrated embodiment, the test pads 305 and the first lower portions 301L of the first connectors 301 have the same height.

In other embodiments, the first connectors 301 and the test pads 305 may be formed sequentially using methods similar to that described in the previous paragraph. In such an embodiment, the test pads 305 and the first lower portions 301L of the first connectors 301 may have different heights. In some embodiments, the first lower portions 301L of the first connectors 301 have a first height $H_1$ between about 3 µm and about 50 µm, and a first width $W_1$ between about 10 µm and about 50 µm. In some embodiments, the test pads 305 have a second height $H_2$ between about 3 µm and about 50 µm, and a second width $W_2$ between about 30 µm and about 80 µm.

After the first connectors 301 and the test pads 305 are formed, a second patterned mask (not shown) is formed over the topmost dielectric layer of the RDLs 201. In some embodiments, the second patterned mask comprises a photoresist material, or any photo-patternable material. A material of the second patterned mask is deposited, irradiated (exposed) and developed to remove portions of the material and form openings. The second patterned mask masks the first connectors 301 and the test pads 305 while exposes the second portions of the one or more conductive features 205 through the openings in the second patterned mask.

The openings are subsequently filled with a conductive material, thereby forming the second lower portions 303L of the second connectors 303. In some embodiments, the openings are further filled by solder material to form the second upper portions 303U of the second connectors 303 and complete formation of the second connectors 303. After the second connectors 303 are formed, the second patterned mask is removed. In an embodiment with the second patterned mask comprising a photoresist material, the second patterned mask may be removed using, for example, ashing followed by a wet clean process. In some embodiments, the second lower portions 303L of the second connectors 303 have a third height $H_3$ between about 5 µm and about 600 µm, and a third width $W_3$ between about 40 µm and about 600 µm.

In some embodiments, the formation of the first connectors 301 and the second connectors 303 may include the formation of under bump metallurgies (UBMs) (not shown) interposed between the first connectors 301 and the first portions of the one or more conductive features 205, and between the second connectors 303 and the second portions of the one or more conductive features 205. In some embodiment, the UBMs may comprise one or more layers of a suitable conductive material.

Furthermore, the first connectors 301 and the second connectors 303 may have different sizes as illustrated in FIG. 3. In some embodiments, the first connectors 301 may be micro-bumps, while the second connectors may be controlled collapse chip connection (C4) bumps. Different sizes of the first connectors 301 and the second connectors 303 allow different devices to be bonded to the dies 105. For example, the first connectors 301 may be used to electrically connect the dies 105 to other dies, and the second connectors 303 may be used to electrically connect the dies 105 to a package substrate, a printed circuit board, an interposer, another die, wafer, or the like. In addition, in some embodiments, the first connectors 301, the second connectors 303, and the test pads 305 are electrically coupled via the RDLs 201.

Referring to FIGS. 4-6, as described below in greater detail, a semiconductor device 400 is formed by stacking multiple tiers of workpieces on the semiconductor device 100. After each tier of workpieces is mounted on the semiconductor device 100, an E-test is performed to identify KGSs and KBSs. In some embodiments, subsequent stacking is performed atop only the KGSs and, therefore, after completing all stacking steps, number of the workpieces in each of the stacked devices as well as thicknesses of the stacked devices may vary. In what follows, in the illustrated embodiments, three tiers of workpieces are attached to the semiconductor device 100. In other embodiments, number of the tiers may vary according to design specifications for the stacked devices.

Turning first to FIG. 4, first tier workpieces 401 are mounted on the semiconductor device 100 atop the dies 105 using the first connectors 301 to form first tier stacks 403, 405 and 407. In some embodiments, the first tier workpieces 401 and other subsequently stacked workpieces comprise one or more system-on-chips (SoCs), memory chips, memory cubes, processor chips, logic chips, analog chips, the like, or combinations thereof.

Referring further to FIG. 4, after the first tier workpieces 401 are mounted on the semiconductor device 100 as described above, electrical and/or functional testing (E-test) is performed to ensure proper functioning of the first tier stacks 403, 405 and 407. In some embodiments, a first E-test 409 is performed resulting in, for example, a "pass" indication for the first tier stacks 403 and 405, and a "fail" indication for the first tier stack 407. Based on the results of the first E-test 409, the first tier stacks 403 and 405 are identified as KGSs, while the first tier stack 407 is identified as a KBS. In some embodiments, E-tests (such as the first E-test 409) may comprise an open/short test, a circuit probe test, a KGS test, a leakage test, the like, or a combination thereof.

Referring to FIG. 5, subsequently second tier workpieces 501 are mounted atop some of the first tier stacks to form second tier stacks 503 and 505. Because the first tier stack 407 is identified as a KBS, no subsequent stacking processes are performed on the first tier stack 407. By identifying the first tier stack 407 as a KBS at an intermediate stage, manufacturing costs can be substantially reduced by not mounting additional workpieces atop the first tier stack 407. In addition, no subsequent E-tests are performed on the first tier stack 407. In the illustrated embodiment, the second tier workpieces 501 are mounted atop the first tier stacks 403 and 405 (identified as KGSs). The second tier workpieces 501 may be mounted atop the first tier stacks 403 and 405 using connectors such as, for example, micro-bumps, copper pillars, and the like, which provide electrical connections between the second tier workpieces 501 and the first tier stacks 403 and 405.

Referring further to FIG. 5, after the second tier workpieces 501 are mounted atop the first tier stacks 403 and 405, a second E-test 507 is performed to test the second tier stacks 503 and 505. The second E-test 507 is performed to ensure proper functioning of intermediate stacks, such as the second tier stacks 503 and 505, as a whole. In the illustrated embodiment, only two stacked devices (e.g., the second tier stacks 503 and 505) need to be tested, since the first tier stack 407 has already been flagged as a KBS. For example, the second E-test 507 results in a "fail" indication for the second tier stack 505, and a "pass" indication for the second tier stack 503. Accordingly, the second tier stack 505 is identified as a KBS, and the second tier stack 503 is identified as a KGS, because the second tier stack 503 passed both rounds of E-testing, such as the first E-test 409 and the second E-test 507.

Referring to FIG. 6, third tier workpieces 601 are mounted atop some of the second tier stacks formed during the previous step. The third tier workpieces 601 are mounted atop only KGSs such as the second tier stack 503, which completes formation of stacked devices such as stacked devices 603, 605 and 607 as shown in FIG. 6. In the illustrated embodiment, the stacked device 603 is a complete stack comprising three workpieces, while the stacked devices 605 and 607 are incomplete stacks comprising two workpieces and a single workpiece, respectively. Moreover, the stacked devices 605 and 607 are identical to the second tier stack 505 and the first tier stack 407, respectively, since no additional workpiece are mounted atop the second tier stack 505 and the first tier stack 407 as described above with reference to FIGS. 4-6. Subsequently, a final E-test 609 is performed on the stacked device 603 to ensure proper functioning of the stacked device 603. In the illustrated embodiment, the final E-test 609 results in a "pass" indication for the stacked devices 603. Accordingly, the stacked device 603 is identified as a KGS. In other embodiments, the final E-test 609 preformed on some of the stacked devices (similar to the stacked device 603) may result in a "fail" indication and those stacked devices are identified as KBSs.

After all the stacking steps are completed, the semiconductor device 400 is debonded from the carrier 101 and singulated to form individual stacked devices (such as the stacked devices 603, 605 and 607), for example, by sawing the semiconductor device 400 along the scribe lines 611. In some embodiments, the stacked devices 605 and 607 with incomplete stacks may be functional devices albeit not meeting design requirements for the stacked devices with complete stacks such as the stacked device 603. The stacked devices 605 and 607 could be re-worked if commercially viable, or could be singulated and sold as non-fully-stacked devices. Subsequently, the singulated stacked devices may be packaged to form integrated circuit packages.

As described in greater detail above, in the illustrated embodiments, stacked devices (such as the stacked devices 603, 605 and 607) comprise at most three workpieces. However, in other embodiments, the stacked devices may comprise any number of workpieces according to design specifications for the stacked devices. Furthermore, numerous variations of the above discussed embodiments will be apparent to those skilled in the art once informed by the present disclosure.

Figure 7:
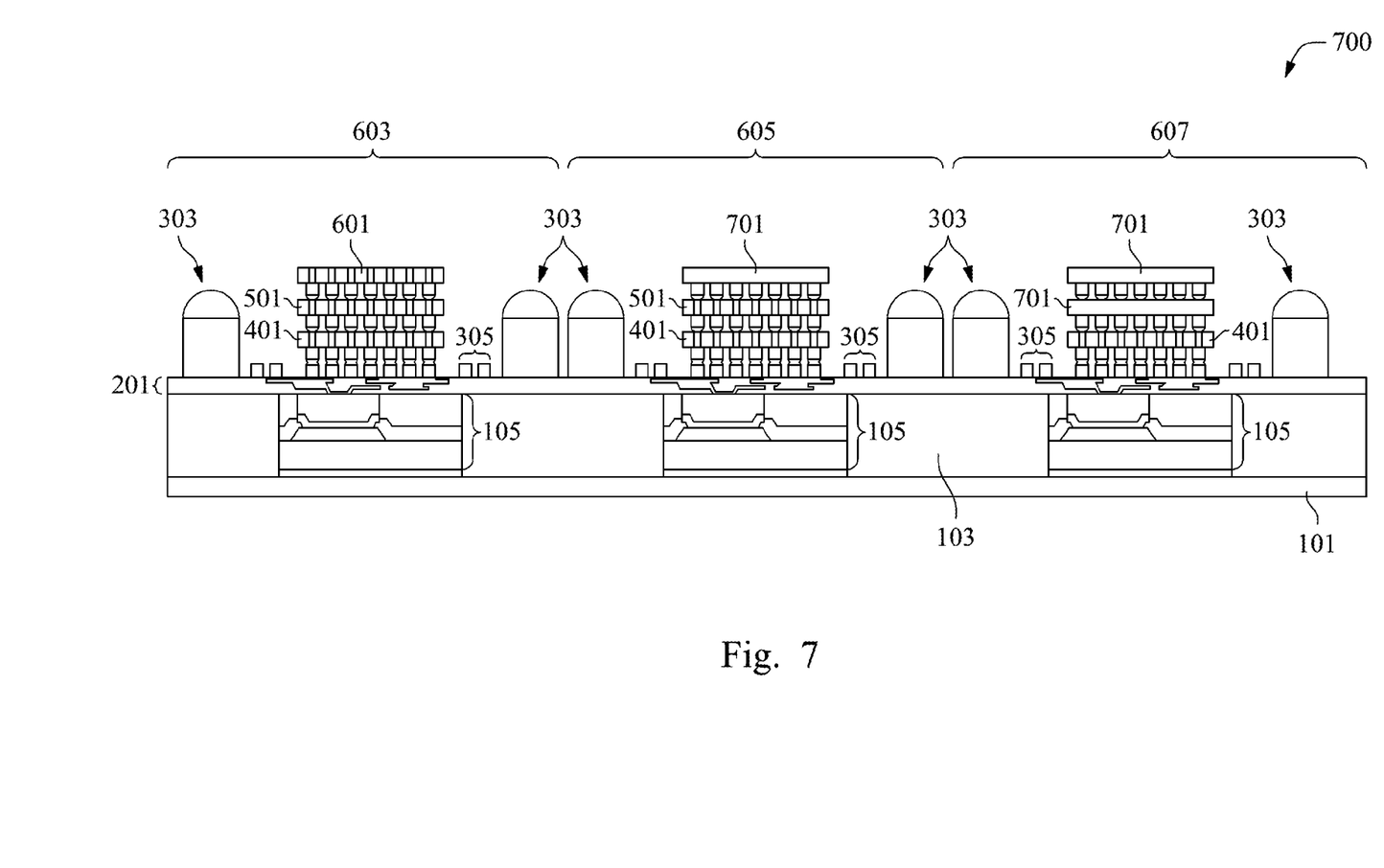
FIG. 7 is a cross-sectional view of stacked semiconductor devices in accordance with some embodiments.

FIG. 6 illustrates an embodiment, wherein the stacked devices (such as the stacked devices 603, 605 and 607) have varying thicknesses. In other embodiments, all the stacked devices may have the same thicknesses. For example, FIG. 7 illustrates a cross-sectional view of a semiconductor device 700 formed using a method similar to that described above with reference to FIGS. 1-6. In the illustrated embodiment, the semiconductor device 700 has a uniform thickness. Referring to FIG. 7, dummy workpieces 701 are mounted atop KBSs (such as the first tier stack 407 and the second tier stack 505 illustrated in FIG. 5) such that all stacked devices (such as the stacked devices 603, 605 and 607) have the same number of workpieces (including functional as well as dummy workpieces). In the illustrated embodiment, all workpieces (functional as well as dummy workpieces) have the same height and, therefore, the stacked devices 603, 605 and 607 have the same thicknesses as illustrated in FIG. 7. In some embodiments, the dummy workpieces 701 are dies and/or interposers that are free of active and/or passive devices and do not provide additional functionalities to the stacked devices. In other embodiments, the dummy workpieces 701 may be known bad dies (KBDs).

Referring further to FIG. 7, in some embodiments, the dummy workpieces 701 are mounted atop the KBSs (such as the first tier stack 407 and the second tier stack 505 illustrated in FIG. 5) after all functional workpieces are mounted atop the semiconductor device 700. In other embodiments, the dummy workpieces 701 are mounted atop the KBSs while mounting the functional workpieces atop the semiconductor device 700. Subsequently, the stacked devices 603, 605, and 607 may be singulated for packaging in integrated circuit packages.

Figure 8:
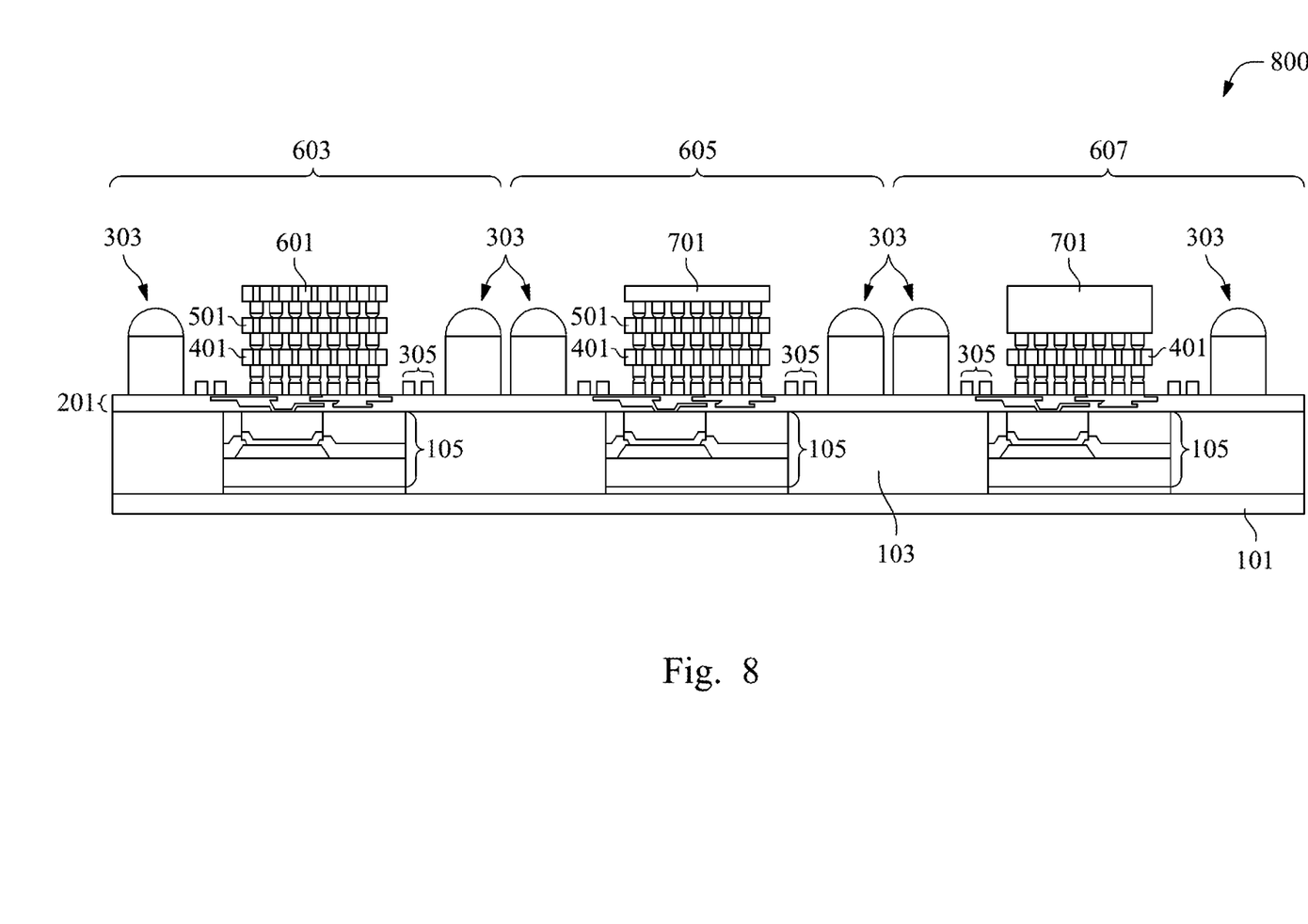
FIG. 8 is a cross-sectional view of stacked semiconductor devices in accordance with some embodiments.

FIG. 8 illustrates a cross-sectional view of a semiconductor device 800 (similar to the semiconductor device 700) having a uniform thickness in accordance with some embodiments. In the illustrated embodiment, the dummy workpieces 701 have various thicknesses. Therefore an appropriate number of the dummy workpieces 701 are mounted atop KBSs (such as the first tier stack 407 and the second tier stack 505 illustrated in FIG. 5) such that thicknesses of all the stacked devices (such as the stacked devices 603, 605 and 607) are the same. In the illustrated embodiments, the stacked devices 603, 605, 607 have different number of workpieces (functional as well as dummy workpieces) but have the same thicknesses.

Referring further to FIG. 8, in some embodiments, the dummy workpieces 701 are mounted atop the KBSs (such as the first tier stack 407 and the second tier stack 505 illustrated in FIG. 5) after all functional workpieces are mounted atop the semiconductor device 800. In other embodiments, the dummy workpieces 701 are mounted atop the KBSs while mounting the functional workpieces atop the semiconductor device 800. Subsequently, the stacked devices 603, 605, and 607 may be singulated for packaging in integrated circuit packages.

Figure 9A:
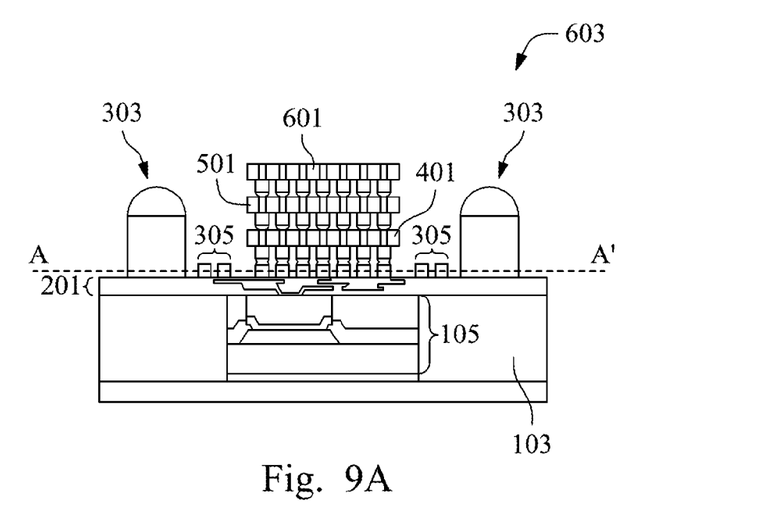
FIGS. 9A and 9B illustrate cross-sectional and top views, respectively, of a stacked semiconductor device in accordance with some embodiments.
Figure 9B:
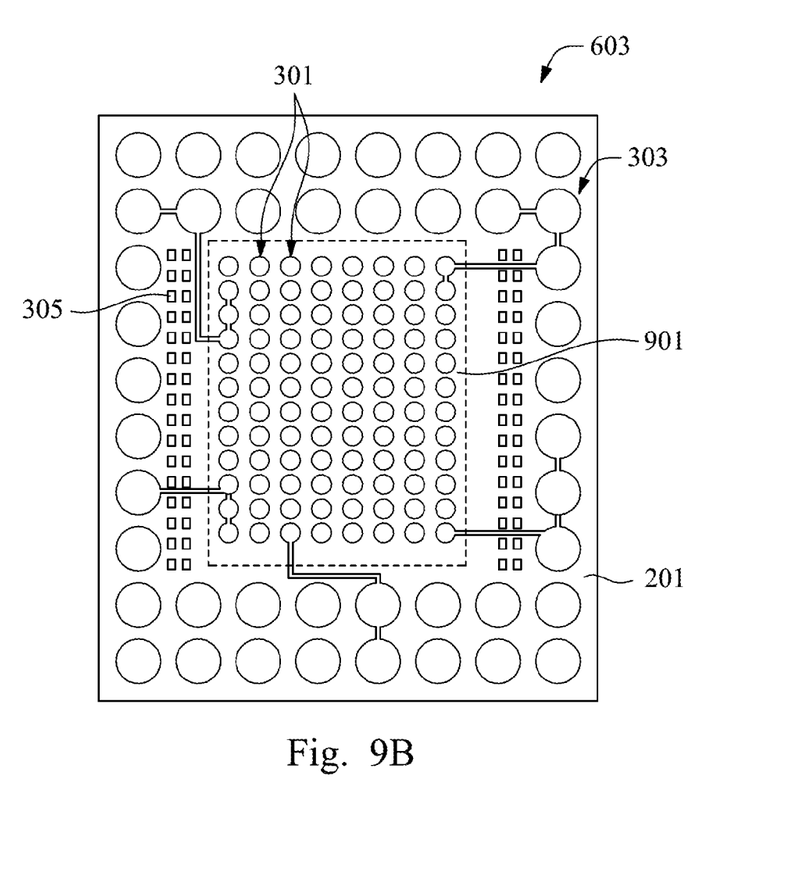

FIGS. 9A and 9B illustrate cross-sectional and top views (along a line AA' in FIG. 9A), respectively, of the stacked device 603 (see FIG. 6) formed according to the method described above with reference to FIGS. 1-6. Referring to FIG. 9A, in the illustrated embodiment, a height of stacked workpieces (such as a stack of the first tier workpiece 401, the second tier workpiece 501 and the third tier workpiece 601) is larger than a height of the second connectors 303. In other embodiments, the height of the stacked workpiece may equal to or may be less than the height of the second connectors 303 depending on design specifications of the stacked device 603. Referring to FIG. 9B, a chip area 901 (indicated by the dashed line) represents projection of the stacked workpieces on a top surface of the RDLs 201. In the illustrated embodiment, the test pads 305 have rectangular shapes as illustrated in FIG. 9B. One skilled in the art will recognize that the particular shape of the test pads 305 is provided for illustrative purpose only and is not limiting the scope of the present disclosure. In other embodiments, the test pads 305 may have variety of shapes such as circular, square, oval, polygonal, or the like.

Referring further to FIGS. 9A and 9B, in the illustrated embodiment, the test pads 305 are formed outside the chip are 901, between the first connectors 301 and the second connectors 303. In some embodiments, the test pads 305 may be formed near the scribe lines 611 (see FIG. 6), and thus may be located near edges of the stacked device 603. In other embodiments, the test pads 305 may be formed in any available area outside of the chip area 901. One skilled in the art will recognize that number of the test pads 305 illustrated in FIG. 9B is provided for illustrative purpose only and is not limiting the scope of the present disclosure. In other embodiments, the number of the test pads 305 may vary according to design requirements for the stacked device 603.

Figure 10:
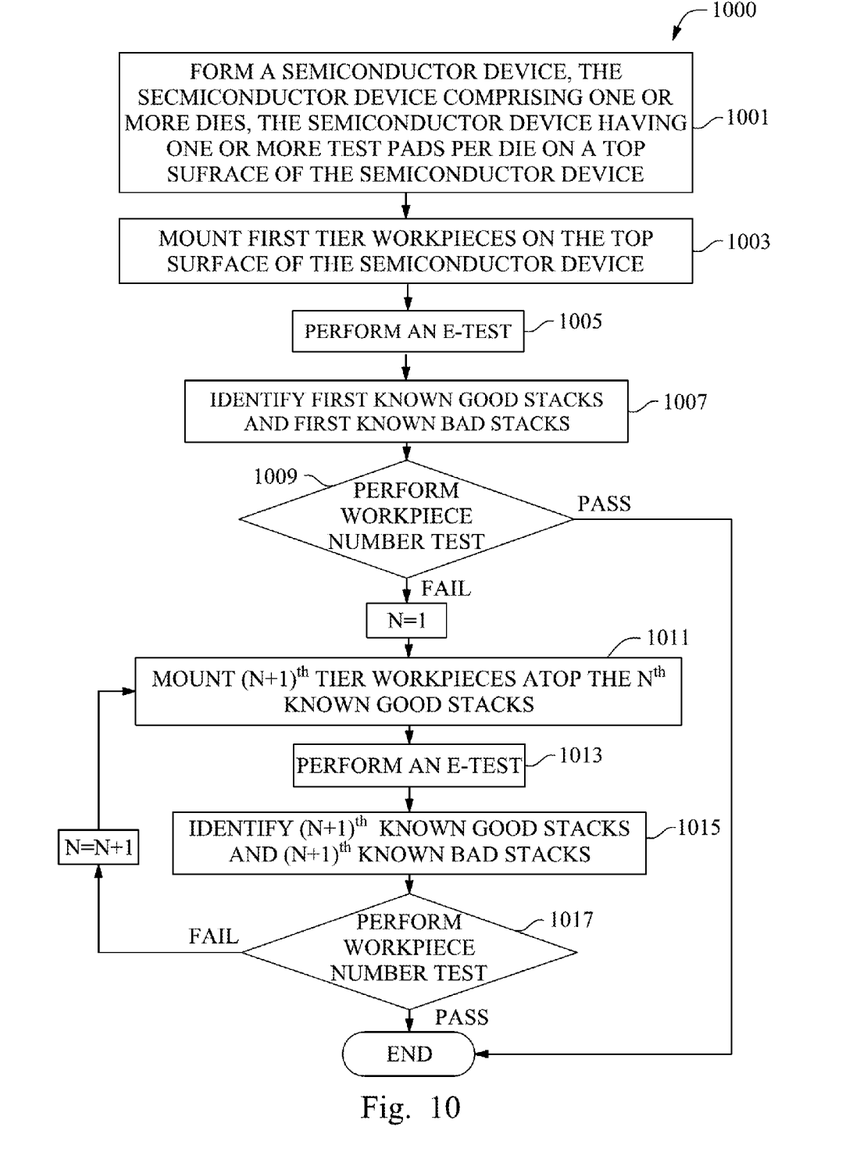
FIG. 10 is a flow diagram illustrating a method of forming stacked semiconductor devices in accordance with some embodiments.

FIG. 10 is a flowchart illustrating a method for forming stacked devices in accordance with some embodiments. The method starts with step 1001, wherein a semiconductor device (such as the semiconductor device 100 illustrated in FIG. 3) is formed as described above with reference to FIGS. 1-3. The semiconductor device may comprise one or more integrated circuit dies (such the dies 105) and having one or more test pads (such as the test pads 305) per integrated circuit die on a top surface of the semiconductor device as described above with reference to FIG. 3. The method continues to step 1003, wherein first tier workpieces are mounted on the top surface of the semiconductor device and atop the integrated circuit dies to form first tier stacks (such as the first tier stacks 403, 405 and 407) as described above with reference to FIG. 4. In step 1005, an E-test is performed on each of the first tier stacks. Depending on results of the E-test, in step 1007, known bad stacks (such as the first tier stack 407) are identified, which comprise first tier stacks that failed the E-test as described above with reference to FIG. 4. In addition, known good stacks (such as the first tier stacks 403 and 405) are identified, which comprise first tier stacks that passed the E-test as described above with reference to FIG. 4. Subsequently, in step 1009, a workpiece number test is performed on each of the known good stacks. If a number of workpieces in each of the known good stacks is equal to the desired number (e.g., one set by design specifications) the method ends at this step.

Otherwise, the method continues to step 1011, wherein second tier workpieces are mounted on the known good stacks to form second tier stacks (such as the second tier stacks 503 and 505) as described above with reference to FIG. 5. In step 1013, an E-test is performed on each of the second tier stacks as discussed above with reference to FIG. 5. Depending on results of the E-test, in step 1015, known bad stacks (such as the second tier stack 505) are identified, which comprise second tier stacks that failed the E-test as discussed above with reference to FIG. 5. In addition, known good stacks (such as the second tier stack 503) are identified, which comprise second tier stacks that passed the E-test as discussed above with reference to FIG. 5. Subsequently, in step 1017, a workpiece number test is performed on each of the known good stacks. If a number of workpieces in each of the known good stacks is equal to the desired number (e.g., one set by design specifications) the method ends at this step. Otherwise, steps 1011-1017 are repeated one or more times until know good stacks comprise the desired number of workpieces.

According to an embodiment, a method comprises forming a semiconductor device. The semiconductor device comprises integrated circuit dies and has at least one test pad per integrated circuit die on a first side of the semiconductor device. The method further comprises mounting first tier workpieces on the first side of the semiconductor device, thereby forming first tier stacks, wherein the first tier workpieces are electrically coupled to corresponding integrated circuit dies, and testing each of the first tier stacks and identifying first known good stacks and first known bad stacks.

According to another embodiment, a method comprises forming a semiconductor device. The semiconductor device comprises integrated circuit dies, at least one first connector and at least one second connector per integrated circuit die on a first side of the semiconductor device, the at least one first connector and the at least one second connector being electrically coupled to a corresponding integrated circuit die. The semiconductor device further comprises at least one test pad per integrated circuit die on the first side of the semiconductor device, the at least one test pad being electrically coupled to the corresponding integrated circuit die. The method further comprises mounting first tier workpieces on the first side of the semiconductor device using the at least one first connector, thereby forming first tier stacks, and testing each of the first tier stacks using the at least one test pad to identify first known good stacks and first known bad stacks.

According to yet another embodiment, a stacked semiconductor device comprises a semiconductor device. The semiconductor device comprises one or more integrated circuit dies, and first connectors and second connectors on a first side of the semiconductor device, the first connectors and the second connectors being electrically coupled to the one or more integrated circuit dies. The semiconductor device further comprises one or more test pads on the first side of the semiconductor device, the one or more test pads being electrically coupled to the first connectors, the one or more test pads being interposed between the first connectors and the second connectors. The tacked semiconductor device further comprises a stack of one or more workpieces on the first side of the semiconductor device, the stack of one or more workpieces being mounted to the semiconductor device using the first connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor device, the semiconductor device comprising integrated circuit dies, the semiconductor device having at least one test pad per integrated circuit die on a first side of the semiconductor device and having at least one external connector per integrated circuit die disposed on the first side of the semiconductor device;
   mounting first tier workpieces on the first side of the semiconductor device, thereby forming first tier stacks, wherein the first tier workpieces are electrically coupled to corresponding integrated circuit dies, wherein the at least one test pad per integrated circuit die is interposed between a respective first tier workpiece on the integrated circuit die and the respective at least one external connector on the integrated circuit die; and
   testing each of the first tier stacks and identifying first known good stacks and first known bad stacks.

2. The method of claim 1, wherein at least one of the first tier workpieces comprises an integrated circuit die.

3. The method of claim 1, wherein at least one of the first tier workpieces comprises an interposer.

4. The method of claim 1, further comprising mounting dummy workpieces atop the first known bad stacks.

5. The method of claim 1, wherein testing each of the first tier stacks comprises using the at least one test pad to test functionality of each of the first tier stacks.

6. The method of claim 1, further comprising:
   mounting second tier workpieces atop the first known good stacks, thereby forming second tier stacks; and
   testing each of the second tier stacks and identifying second known good stacks and second known bad stacks.

7. The method of claim 6, further comprising mounting dummy workpieces atop the second known bad stacks.

8. A method comprising:
   forming a semiconductor device, the semiconductor device comprising:
   integrated circuit dies;
   at least one first connector and at least one second connector per integrated circuit die on a first side of the semiconductor device, the at least one first connector and the at least one second connector being electrically coupled to a corresponding integrated circuit die; and
   at least one test pad per integrated circuit die on the first side of the semiconductor device, the at least one test pad being electrically coupled to the corresponding integrated circuit die;
   mounting first tier workpieces on the first side of the semiconductor device using the at least one first connector, thereby forming first tier stacks;
   testing each of the first tier stacks using the at least one test pad to identify first known good stacks and first known bad stacks; and
   mounting dummy workpieces atop the first known bad stacks.

9. The method of claim 8, wherein at least one of the first tier workpieces comprises an integrated circuit die.

10. The method of claim 8, wherein at least one of the first tier workpieces comprises an interposer.

11. The method of claim 8, wherein the at least one test pad is interposed between the at least one first connector and the at least one second connector.

12. The method of claim 8, wherein the at least one test pad and the at least one first connector are formed by a same process.

13. The method of claim 8, further comprising:
   mounting second tier workpieces atop the first known good stacks, thereby forming second tier stacks; and
   testing each of the second tier stacks using the at least one test pad to identify second known good stacks and second known bad stacks.

14. A method comprising:
   attaching a plurality of integrated circuit dies to a carrier;
   forming a molding compound over the carrier and around each of the plurality of integrated circuit dies;
   forming one or more redistribution layers (RDLs) over the molding compound and the plurality of integrated circuit dies;
   forming a plurality of first connectors over the one or more RDLs;
   forming a plurality of second connectors over the one or more RDLs, wherein a size of the plurality of first connectors is different from a size of the plurality of second connectors;
   forming a plurality of test pads over the one or more RDLs, wherein the one or more RDLs electrically couple the plurality of first connectors, the plurality of second connectors and the plurality of test pads to the plurality of integrated circuit dies;
   bonding first tier workpieces to the one or more RDLs using the plurality of first connectors, thereby forming first tier stacks, wherein each of the first tier stacks comprises one of the plurality of integrated circuit dies and one of the first tier workpieces; and
   testing the first tier stacks using the plurality of testing pads to identify first known good stacks and first known bad stacks.

15. The method of claim 14, further comprising mounting dummy workpieces atop the first known bad stacks.

16. The method of claim 14, further comprising:
   mounting second tier workpieces atop the first known good stacks, thereby forming second tier stacks; and
   testing the second tier stacks using the plurality of testing pads to identify second known good stacks and second known bad stacks.

17. The method of claim 16, further comprising mounting dummy workpieces atop the first known bad stacks and the second known bad stacks.

18. The method of claim 14, wherein the plurality of first connectors and the plurality of test pads are formed using a same method.

19. The method of claim 14, wherein testing the first tier stacks comprises performing electronic functional testing on the first tier stacks.

* * * * *